United States Patent
Feurle

(10) Patent No.: US 6,894,379 B2
(45) Date of Patent: May 17, 2005

(54) SHARING OF MULTIPLE-ACCESS SIGNAL LINE IN A PRINTED CIRCUIT BOARD

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/219,828

(22) Filed: Aug. 15, 2002

(65) Prior Publication Data

US 2003/0089982 A1 May 15, 2003

(30) Foreign Application Priority Data

Aug. 16, 2001 (DE) .......................................... 101 39 085

(51) Int. Cl.⁷ .............................................. H01L 23/02
(52) U.S. Cl. ........................ 257/686; 257/777; 257/778
(58) Field of Search ................................ 257/686, 723, 257/777, 778

(56) References Cited

U.S. PATENT DOCUMENTS

| | | | |
|---|---|---|---|
| 5,260,892 A | | 11/1993 | Testa ............................ 365/63 |
| 5,473,198 A | * | 12/1995 | Hagiya et al. ............... 257/786 |
| 5,999,437 A | | 12/1999 | Chengson et al. ............ 365/52 |
| 6,191,472 B1 | * | 2/2001 | Mazumder ................... 257/691 |
| 6,549,975 B2 | * | 4/2003 | Roohparvar ................ 711/104 |
| 2001/0004335 A1 | | 6/2001 | Murakami ................... 365/233 |
| 2003/0094685 A1 | * | 5/2003 | Shiraishi et al. ............. 257/686 |

FOREIGN PATENT DOCUMENTS

DE          69226845 T 2          11/1992          ............ G11C/5/00

OTHER PUBLICATIONS

"Electronic Welt '95", catalog published by Conrad Elctronic pp. 596,780,850 in Sep. 1994.

* cited by examiner

Primary Examiner—Phat X. Cao
(74) Attorney, Agent, or Firm—Fish & Richardson P.C.

(57) ABSTRACT

A printed circuit board system includes a printed circuit board device having a multiple access signal line. A plurality of semiconductor apparatuses are arranged on the printed circuit board device. Each semiconductor apparatus includes a signal connection point to be connected to the multiple access signal line; and a signal transmission device for controlling presence of an output signal at the signal connection point.

15 Claims, 3 Drawing Sheets

| /CS | DQS | OUT |
|---|---|---|
| 0 | 1 | 1 |
| 0 | 0 | 0 |
| 1 | 1 | H |
| 1 | 0 | H |

SHARING OF MULTIPLE-ACCESS SIGNAL LINE IN A PRINTED CIRCUIT BOARD

FIELD OF INVENTION

The present invention relates to a printed circuit board system, and in particular, to the connection of semiconductor devices to a printed circuit board.

RELATED APPLICATIONS

This application claims the benefit of the Aug. 16, 2001 filing date of German patent application 101 39 085.8-34, the contents of which are herein incorporated by reference.

BACKGROUND

Printed circuit board systems are known which comprise printed circuit board devices and a plurality of semiconductor apparatuses, the semiconductor apparatuses being connected to the printed circuit board device for signalling purposes via signal connection points. To ensure reliable signal transmission, each signal connection point is connected to a respective signal line on the printed circuit board device for signalling purposes. As the number of signals increases, and hence the number of signal connection points required increases, the problem arises that the number of pins on the controller for the printed circuit board system likewise needs to be increased, which can frequently cause problems.

SUMMARY

It is thus an object of the present invention to provide a printed circuit board system, a method for operating a printed circuit board system, a printed circuit board device and use thereof, and a semiconductor apparatus and use thereof which permit better utilization of the available resources.

On the basis of the present invention, a printed circuit board system is provided which comprises at least two semiconductor apparatuses having a respective multiplicity of signal connection points, and a printed circuit board device having a multiplicity of signal lines, which printed circuit board device has or can have the at least two semiconductor apparatuses arranged on it and is or can be used for connecting signal connection points to the signal lines for signalling purposes, where the multiplicity of signal lines comprises at least one multiple access signal line which is or can be connected to a respective connection point of at least two semiconductor apparatuses for signalling purposes in order to send signals to the multiple access signal line, and where the semiconductor apparatuses respectively comprise at least one signal transmission device which can be used to prompt or to prevent sending of signals to the multiple access signal line.

The provision of at least one multiple access signal line in the printed circuit board device and of a respective signal transmission device in the at least two semiconductor apparatuses allows a signal line to be used jointly by a plurality of, preferably two, semiconductor apparatuses, so that the total number of signal lines required can be reduced. As a consequence, the number of pins required on the controller for the printed circuit board system can be reduced, or the pins which are thus no longer required can be used in another way.

Preferably, the multiplicity of signal connection points respectively comprises at least one output clock connection point or DQS connection point for outputting a digital output clock signal, and the multiplicity of signal lines comprises at least one output clock line for transmitting the output clock signal, the at least one output clock line being a multiple access signal line.

The output clock signal or data strobe signal or DQS signal or the semiconductor chip's transmitted synchronization signal from at least two different semiconductor apparatuses can advantageously be sent to a jointly used signal line on the printed circuit board device.

In one preferred embodiment, the multiplicity of signal connection points respectively comprises at least one semiconductor apparatus selection connection point for selecting one of the at least two semiconductor apparatuses using a semiconductor apparatus selection signal.

It is thus advantageously possible to stipulate which of the semiconductor apparatuses can send signals to the multiple access signal line.

Preferably, the signal transmission device comprises a tristate logic circuit which is connected upstream of the connection point connected to the multiple access signal line for signalling purposes and whose first input has the semiconductor apparatus selection signal applied to it when the semiconductor apparatus has been selected, or has a signal which is the logic inverse of the semiconductor apparatus selection signal applied to it when the semiconductor apparatus has not been selected, whose second input has the digital signal to be sent to the multiple access signal line applied to it, and whose output signal corresponds to the digital signal to be sent to the multiple access signal line when the semiconductor apparatus has been selected, or adopts a high-impedance state when the semiconductor apparatus has not been selected.

The tristate logic circuit thus makes it possible either to output the signal which is applied to the second input of the tristate logic circuit and is to be sent to the multiple access signal line at the output, or to switch the output to a high-impedance state, so that no signals are produced at the output. It is thus possible to use the semiconductor apparatus selection signal to control which semiconductor apparatus sends signals to the multiple access signal line. Furthermore, it is possible to prevent the at least two semiconductor apparatuses from conflicting, i.e. to prevent, by way of example, an output signal from one semiconductor apparatus from being produced at a corresponding connection point of another semiconductor apparatus, and hence to prevent parallel-path currents and/or unwanted effects from being able to occur.

In one preferred embodiment, two semiconductor apparatuses are provided which are or can be arranged on opposite sides of the printed circuit board device, preferably mirror-image symmetrically with respect to the printed circuit board device.

The provision of two semiconductor apparatuses on opposite sides of the printed circuit board device can allow an advantageous arrangement of the signal lines in the printed circuit board device.

Preferably, the signal connection points of the semiconductor apparatuses are used essentially mirror-image symmetrically with respect to a central axis, preferably the longitudinal central axis, of the semiconductor apparatus.

The mirror-image symmetrical use of the signal connection points also allows the arrangement of the signal lines in the printed circuit board device to be simplified.

Preferably, the semiconductor apparatuses are respectively in the form of a BGA chip (ball grid array chip).

In one preferred embodiment, the propagation-time difference for the respective signals which are to be sent to the multiple access signal line on the printed circuit board device is small, preferably less than 100 ps, usually preferably less than 50 ps. The tolerable propagation-time difference is definitively determined by the jitter tolerance of the system. This is intended to ensure that the time offset or time skew for the transmitted signals is kept as small as possible. The fact that the propagation-time difference for the signals is small makes it possible to achieve reliable reading of the signals sent via the multiple access signal line.

Preferably, the at least one multiple access signal line is arranged essentially centrally with respect to the thickness of the printed circuit board device and comprises at least two line sections for connecting the at least two of the semiconductor apparatuses for signalling purposes, the at least two line sections essentially having the same electrical and/or propagation-time properties, preferably the same length. This makes it possible to ensure that the propagation-time difference for the respective signals which are to be sent to the multiple access signal line is kept small on the printed circuit board device.

Preferably, the line sections run essentially at right angles to the multiple access signal line and are preferably in the form of a through-connection or vias through the entire printed circuit board device. This allows the printed circuit board device to be designed in a simple manner.

The present invention also provides a method for operating a printed circuit board system, particularly a printed circuit board system as described above, where the printed circuit board system comprises at least two semiconductor apparatuses having a multiplicity of signal connection points and a printed circuit board device having at least one multiple access signal line, the method comprising the following steps:

a) a semiconductor apparatus is selected from the at least two semiconductor apparatuses;

b) the selected semiconductor apparatus is prompted to send signals to the multiple access signal line; and c) the at least one unselected semiconductor apparatus is prevented from sending signals to the multiple access signal line.

By prompting the selected semiconductor apparatus to send signals to the multiple access signal line and preventing the at least one unselected semiconductor apparatus from sending signals to the multiple access signal line, it is possible to ensure that only the one selected semiconductor apparatus sends signals to the multiple access signal line in each case. It is thus possible to prevent the semiconductor apparatuses from conflicting and to prevent parallel-path currents from arising.

Preferably, the selection step comprises a step of transmitting a semiconductor apparatus selection signal to the appropriate semiconductor apparatus.

In one preferred embodiment, the printed circuit board system comprises a tristate logic circuit whose output is or can be connected to the multiple access signal line for signalling purposes, step b) comprising the following steps:

b1) the semiconductor apparatus selection signal and the signal to be sent to the multiple access signal line are applied to the inputs of a tristate logic circuit; and b2) the tristate logic circuit is switched, so that the signal to be sent is produced at the output of the tristate logic circuit.

Preferably, step c) comprises the following steps:

c1) a signal which is the logic inverse of the semiconductor apparatus selection signal is applied to one input of the tristate logic circuit;

c2) the tristate logic circuit is switched, so that the output of the tristate logic circuit adopts a high-impedance state.

The invention also provides a printed circuit board device having a multiplicity of signal lines, which printed circuit board device can have at least two semiconductor apparatuses having a respective multiplicity of signal connection points arranged on it, where the multiplicity of signal lines comprises at least one multiple access signal line which is designed such as to allow connection to at least two of the semiconductor apparatuses for signalling purposes.

Preferably, the multiple access signal line is an output clock line or DQS line.

Preferably, the at least one multiple access signal line is arranged essentially centrally with respect to the thickness of the printed circuit board device and comprises at least two line sections for connecting the at least two of the semiconductor apparatuses for signalling purposes, the at least two line sections essentially having the same electrical and/or propagation-time properties, preferably the same length.

In one preferred embodiment, the line sections run essentially at right angles to the multiple access signal line and are preferably in the form of a through-connection through the entire printed circuit board device.

The invention also provides the use of a printed circuit board device as described above in a printed circuit board system as described above or in a method which is described above.

In addition, the invention provides a semiconductor apparatus having a multiplicity of signal connection points which can be connected to a printed circuit board device, on which at least two semiconductor apparatuses can be arranged, for signalling purposes, where the semiconductor apparatus comprises at least one signal transmission device which can be used to prompt or to prevent sending of signals to the multiple access signal line.

Preferably, the semiconductor apparatus comprises a multiplicity of signal connection points, and the signal connection points are used essentially mirror-image symmetrically with respect to a central axis, preferably the longitudinal central axis, of the semiconductor apparatus.

In one preferred embodiment, the multiplicity of signal connection points respectively comprises at least one output clock connection point for outputting a digital output clock signal.

Preferably, the multiplicity of signal connection points respectively comprises at least one semiconductor apparatus selection connection point for selecting the semiconductor apparatus using a semiconductor apparatus selection signal.

Preferably, the signal transmission device comprises a tristate logic circuit which is connected upstream of a connection point and whose first input has the semiconductor apparatus selection signal applied to it when the semiconductor apparatus has been selected, or has a signal which is the logic inverse of the semiconductor apparatus selection signal applied to it when the semiconductor apparatus has not been selected, and whose second input has the digital signal to be sent via the connection point applied to it, and whose output signal corresponds to the digital signal to be sent via the connection point when the semiconductor apparatus has been selected, or adopts a high-impedance state when the semiconductor apparatus has not been selected.

Preferably, the semiconductor apparatus is in the form of a BGA chip.

The present invention also provides the use of a semiconductor apparatus as described above in a printed circuit board system as described above or in a method which is described above.

Other tasks, features and advantages of the present invention become obvious from the description below of a preferred embodiment of the present invention with reference to the drawings, in which:

DETAILED DESCRIPTION

Figure 1:
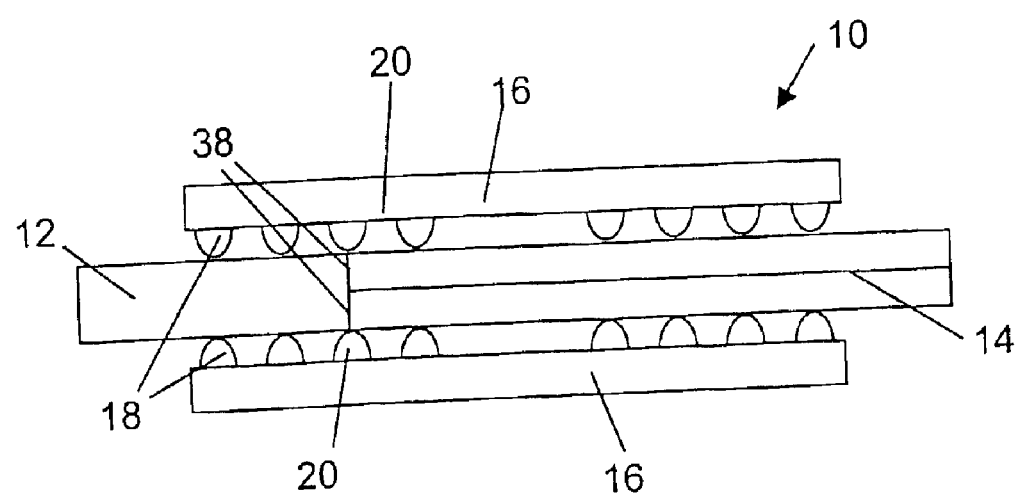
FIG. 1 shows a sectional view of a printed circuit board system based on a preferred embodiment of the present invention.

FIG. 1 shows a sectional view of a printed circuit board system 10 based on a preferred embodiment of the present invention.

The inventive printed circuit board system or the inventive board structure 10 comprises a printed circuit board device 12, which can preferably be a printed circuit board, circuit card, board or plug-in card. The printed circuit board device 12 comprises a multiplicity of layers (not shown) with signal lines 14 arranged so as to be insulated from one another; there are preferably 12 to 20 layers provided.

In the preferred embodiment, the printed circuit board system 10 also comprises two semiconductor apparatuses 16, which preferably each comprise a semiconductor chip, preferably a semiconductor memory chip, holding an integrated circuit. However, it is likewise conceivable for more than two semiconductor apparatuses 16 to be provided in the inventive printed circuit board system 14. Since the semiconductor apparatuses 16 shown in FIG. 1 are essentially identical, only one semiconductor apparatus 16 is described below with reference to FIGS. 1 and 2.

Figure 2:
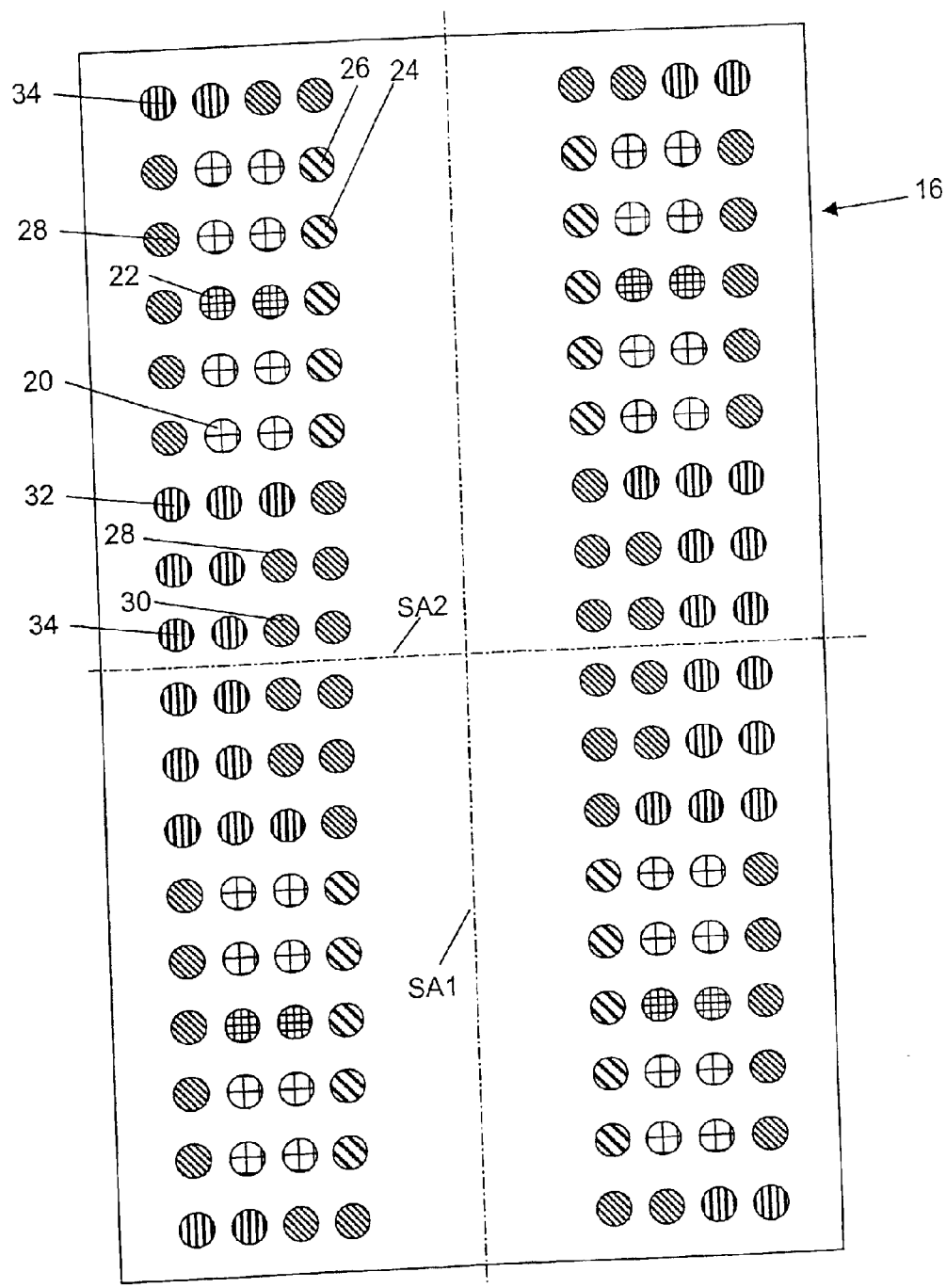
FIG. 2 shows a view from below of a semiconductor apparatus based on a preferred embodiment of the present invention.

FIG. 2 shows a view from below of a semiconductor apparatus 16 based on a preferred embodiment of the present invention.

The semiconductor apparatus 16 comprises a multiplicity of signal connection points or pins 18 for connecting the semiconductor apparatus 16 to the printed circuit board device 12. Preferably, the signal connection points 18 are arranged on the underside of the semiconductor apparatus 16, and the semiconductor apparatus 16 is in the form of a BGA (ball grid array). Furthermore, the semiconductor apparatus 16 can be in the form of a chip size package (CSP), where the size of the semiconductor apparatus 16 corresponds approximately to the size of the semiconductor chip it contains.

The signal connection points 18 are described in detail below with reference to FIG. 2. In this context, identical hatchings are intended to indicate identical or similar types of signals. The inventive semiconductor apparatus 16 comprises DQ connections 20 for inputting and outputting data, and output clock connection points 22 which are used to output the output clock signal or data strobe signal or DQS signal or the semiconductor chip's transmitted synchronization signal to the printed circuit board device 12 in order to synchronize the data which have been read. Furthermore, voltage supply connection points VDDQ 24 are provided on the semiconductor apparatus 16 in order to supply the data connection points with an appropriate voltage. Ground connection points VSSQ 26 corresponding thereto are likewise provided on the semiconductor apparatus 16. VDDQ 24 and VSSQ 26 are also referred to as data supply connection points 24, 26. The semiconductor apparatus 16 also has supply connection points VSS 28 and VDD 30. The semiconductor apparatus 16 also has addressing connection points 32 for inputting address information, and command connection points, e.g. clock CK, chip select/CS, 34 for inputting commands or instructions.

As FIG. 2 shows, the signal connection points of the semiconductor apparatus 16 are preferably used essentially mirror-image symmetrically with respect to the longitudinal central axis SA1 of the semiconductor apparatus 16. Such an arrangement is advantageous, in particular, when the two semiconductor apparatuses 16 are arranged in a "clamp shell arrangement" on the printed circuit board device 12, as described below. It is thus possible to arrange for the signal connection points 18 which jointly use a multiple access signal line 14 to be situated opposite one another. In one preferred embodiment, the signal connection points of the semiconductor apparatus 16 can likewise be used mirror-image symmetrically with respect to the transverse central axis SA2 of the semiconductor apparatus 16.

The printed circuit board device 12 comprises at least one multiple access signal line 14, which is a signal line which is connected to a respective signal connection point of the at least two semiconductor apparatuses 16 for signalling purposes. That is to say that the multiple access signal line 14 is connected to the two semiconductor apparatuses 16 from FIG. 1 for signalling purposes.

The multiple access signal line 14 is preferably designed such that the propagation-time delays of the signals from the two semiconductor apparatuses 16 which are sent via the multiple access signal line 14 are as short as possible, preferably less than 100 ps, usually preferably less than 50 ps. The higher the operating frequency of the printed circuit board system 10, the smaller should be the propagation-time difference for the signals from the two semiconductor apparatuses 16 which are sent via the multiple access signal line 14. By way of example, at an operating frequency of 200 MHz a propagation-time difference of approximately 100 ps can still be permissible, whereas at an operating frequency of 300–400 MHz the propagation-time difference should not exceed 50 ps. This can preferably be achieved by providing the multiple access signal line 14 in a central layer of the printed circuit board device 12. In addition, it is advantageous when line sections 38 provided for the signal connection between the two semiconductor apparatuses 16 have the same or similar electrical and/or propagation-time properties, and preferably the same length. In the embodiment shown in FIG. 1, two line sections are provided which are at right angles to the centrally running multiple access signal line 14. The line sections 38 are preferably in the form of a through-connection through the entire thickness of the printed circuit board device 12, "vias". However, it is likewise conceivable for the line sections 38 to be provided obliquely or at an angle, so long as they have the same electrical and/or propagation-time properties. In addition, it would likewise be possible to provide more than two line sections if a multiple access signal line 14 needed to be connected to more than two semiconductor apparatuses 16.

The multiple access signal line 14 is preferably connected to a respective output clock connection point 20 on the two semiconductor apparatuses 16 for signalling purposes. In the preferred embodiment in the present case, the mirror-image symmetrical semiconductor apparatuses 16 described above are used. These are arranged with mirror-image symmetry on opposite sides of the printed circuit board device 12, preferably in a "clamp shell arrangement". However, it is likewise conceivable for the semiconductor apparatuses 16 to be provided on the printed circuit board device 12 such that, although they are not arranged with mirror-image symmetry with respect to one another, the signal connection points 18 needing to be connected to the respective multiple access signal line 14 are opposite one another or are arranged at corresponding positions on the printed circuit board device 12.

In order to prevent both semiconductor apparatuses 16 from sending signals to the multiple access signal line 14 simultaneously, each semiconductor apparatus 16 contains a tristate logic circuit 40. The tristate logic circuit 40 is respectively positioned upstream of the output clock connection point 20.

The way in which the tristate logic circuit 40 works in the semiconductor apparatus 16 based on the present invention is explained below with reference to FIGS. 3 and 4.

Figure 3:
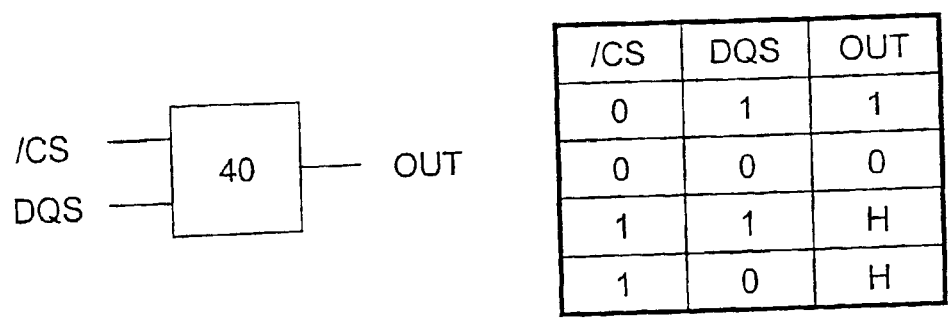
FIG. 3 shows a schematic view and a table of values for a tristate logic circuit.
Figure 4:
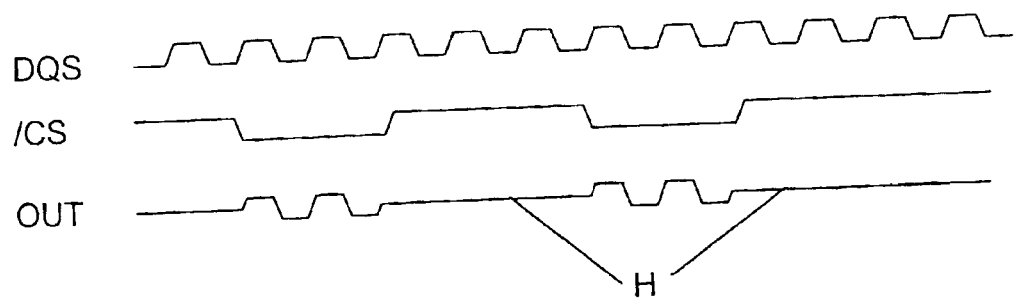
FIG. 4 shows signal profiles for the signals relevant to the tristate logic circuit.

FIG. 3 shows a schematic view of and a table of values for a tristate logic circuit 40, and FIG. 4 shows signal profiles for the signals which are relevant to the tristate logic circuit.

The output clock signal DQS to be transmitted to the multiple access signal line 14 is applied to one input of the tristate logic circuit 40. A semiconductor apparatus selection signal or chip select signal/CS is applied to the other input of the tristate logic circuit 40. The semiconductor apparatus selection signal/CS is transmitted via a semiconductor apparatus selection connection point 34 to either one or the other semiconductor apparatus 16, but never to both simultaneously. The semiconductor apparatus selection signal/CS is preferably a low-active signal, i.e. this signal triggers an action at the low level, for example "0" or "−1".

When a semiconductor apparatus 16 is selected using the semiconductor apparatus selection signal/CS, /CS is thus set to "0", and the output clock signal DQS is thus produced at the output OUT of the tristate logic circuit 40. That is to say that, in this state, the appropriate selected semiconductor apparatus 16 can transmit the output clock signal DQS to the multiple access signal line 14.

When the semiconductor apparatus selection signal is set to the second state again, i.e. to "1" in the present case, the output OUT adopts a high-impedance state "H". This means that no signals can be transferred from this semiconductor apparatus 16 to the multiple access signal line 14.

During the time in which the semiconductor apparatus selection signal/CS is being sent to the first semiconductor apparatus 16, the semiconductor apparatus selection signal/CS for the second semiconductor apparatus 16 is held in a state which is the logic inverse of the semiconductor apparatus selection signal, i.e. at "1". This holds the output of the second semiconductor apparatus 16 in the high-impedance state "H", and no signals can be transmitted from the second semiconductor apparatus 16 to the multiple access signal line 14. It is thus possible to prevent the second semiconductor apparatus 16 from sending signals to the multiple access signal line 14 simultaneously with the first semiconductor apparatus 16.

When the first semiconductor apparatus 16 has finished sending to the multiple access signal line 14, the semiconductor apparatus selection signal/CS is set to "1", and the output OUT consequently adopts a high-impedance state "H". A semiconductor apparatus selection signal/CS can now be sent to the second semiconductor apparatus 16, and the latter can then transmit its output clock signal DQS to the multiple access signal line 14 by switching the appropriate tristate logic circuit 40 in a suitable manner.

By providing the tristate logic circuit 40 in the respective semiconductor apparatuses 16, it is thus possible to prevent both semiconductor apparatuses 16 from sending signals to the multiple access signal line 14 simultaneously. It is also possible to prevent the semiconductor apparatuses 16 from conflicting, i.e. to prevent, by way of example, an output signal from one semiconductor apparatus 16 from being present at a corresponding connection point of the other semiconductor apparatus, and hence to prevent parallel-path currents and/or unwanted effects from being able to occur.

What is claimed is:

1. A printed circuit board system comprising:
 a printed circuit board device having a multiple access signal line;
 a plurality of semiconductor apparatuses arranged on the printed circuit board device, at least two of the semiconductor apparatuses having a signal connection point to be connected to the multiple access signal line; and
 a signal transmission device for controlling presence of an output signal at the signal connection point comprising:
  a tri-state logic circuit having:
   a first input for receiving the selection signal;
   a second input for receiving an output signal to be placed on the multiple access signal line; and an output in communication with the multiple access signal line, the tri-state logic circuit being configured to place the output in a high-impedance state when the selection signal indicates that the semiconductor apparatus is not selected, and to place the output signal on the multiple access signal line when the selection signal indicates that the semiconductor apparatus is selected.

2. The printed circuit board system of claim 1, wherein the signal connection point comprises an output clock connection point for outputting a digital output clock signal; and the multiple access signal line comprises an output clock line for transmitting the digital output clock signal.

3. The printed circuit board system of claim 1, wherein the signal connection point comprises a semiconductor-apparatus-selection connection point for receiving a selection signal, the selection signal causing selection of a semiconductor apparatus from the plurality of semiconductor apparatuses.

4. The printed circuit board system of claim 1, wherein the plurality of semiconductor apparatuses comprises a first semiconductor apparatus arranged on a first side of the printed circuit board device and a second semiconductor apparatus arranged on a second side of the printed circuit board device, the second side being opposite the first side.

5. The printed circuit board of claim 4, wherein the second semiconductor apparatus is arranged on the printed circuit board device to be a mirror image of the first semiconductor apparatus.

6. The printed circuit board device of claim 1, wherein first and second semiconductor apparatuses are arranged to have mirror-image symmetry about a central axis thereof, the central axis being selected from the group consisting of a longitudinal central axis and a transverse central axis.

7. The printed circuit board system of claim 1, wherein the semiconductor apparatuses comprise a BGA chip.

8. The printed circuit board system of claim 1 wherein semiconductor apparatuses and the multiple access signal line are arranged such that a first propagation time for a signal traveling between a first semiconductor apparatus and the multiple access signal line and a second propagation time for a signal traveling between a second semiconductor apparatus and the multiple access signal line differ by no more than 100 picoseconds.

9. The printed circuit board system of claim 1, wherein semiconductor apparatuses and the multiple access signal line are arranged such that a first propagation time for a signal traveling between a first semiconductor apparatus and the multiple access signal line and a second propagation time for a signal traveling between a second semiconductor apparatus and the multiple access signal line differ by no more than 50 picoseconds.

10. The printed circuit board system of claim 1, wherein the multiple access signal line comprises:
   a central section disposed on an interior plane of the printed circuit board, the interior plane being parallel to and located midway between first and second surfaces of the printed circuit board;
   a first connecting section for connecting a first semiconductor apparatus to the central section, the first connecting section extending from the central portion to the first surface; and
   a second connecting section for connecting a second semiconductor apparatus to the central section, the second connecting section extending from the central portion to the second surface.

11. The printed circuit board system of claim 10, wherein the first and second connecting sections are configured to have the same length.

12. The printed circuit board system of claim 10, wherein the first and second connecting sections are configured to have the same electrical properties.

13. The printed circuit board system of claim 10, wherein the first and second connecting sections are configured to have the same signal propagation times.

14. The printed circuit board system of claim 10, wherein the first and second connecting sections are perpendicular to the first and second surfaces.

15. The printed circuit board system of claim 10, wherein the first and second connecting sections comprise walls forming a through-hole extending between the first and second surfaces.

* * * * *